(12) United States Patent
Park et al.

(10) Patent No.: US 10,607,515 B2
(45) Date of Patent: Mar. 31, 2020

(54) DISPLAY DEVICE USING SEMICONDUCTOR LIGHT EMITTING DEVICE AND METHOD FOR MANUFACTURING THE SAME

(71) Applicant: LG ELECTRONICS INC., Seoul (KR)

(72) Inventors: Changseo Park, Seoul (KR); Seongmin Moon, Seoul (KR); Bongchu Shim, Seoul (KR); Kiseong Jeon, Seoul (KR); Hyunwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/415,770

(22) Filed: May 17, 2019

(65) Prior Publication Data

US 2019/0325790 A1    Oct. 24, 2019

Related U.S. Application Data

(63) Continuation of application No. PCT/KR2018/011453, filed on Sep. 27, 2018.

(30) Foreign Application Priority Data

Apr. 19, 2018  (KR) .......................... 10-2018-0045718
Aug. 17, 2018  (KR) .......................... 10-2018-0096299

(51) Int. Cl.
*G09F 9/33* (2006.01)
*H01L 27/15* (2006.01)
(Continued)

(52) U.S. Cl.
CPC .............. *G09F 9/33* (2013.01); *H01L 27/156* (2013.01); *H01L 33/44* (2013.01); *H01L 33/62* (2013.01);
(Continued)

(58) Field of Classification Search
None
See application file for complete search history.

(56) References Cited

U.S. PATENT DOCUMENTS 6,825,049 B2 * 11/2004 Fonstad, Jr. ........ H01L 21/2007
                                                    257/E21.122
7,874,474 B2 *  1/2011 Kim ..................... B23K 1/0016
                                                    228/175
(Continued)

FOREIGN PATENT DOCUMENTS

KR  10-2006-0117210 A   11/2006
KR  10-2012-0122645 A   11/2012
KR  10-2017-02275 A     3/2017

*Primary Examiner* — Lex H Malsawma
(74) *Attorney, Agent, or Firm* — Birch, Stewart, Kolasch & Birch, LLP

(57) ABSTRACT

The present disclosure relates to a display device using semiconductor light emitting devices and a fabrication method thereof, and the display device according to the present disclosure can include a plurality of semiconductor light emitting devices, a first wiring electrode and a second wiring electrode respectively extended from the semiconductor light emitting devices to supply an electric signal to the semiconductor light emitting devices, a plurality of pair electrodes disposed on the substrate, and provided with a first electrode and a second electrode configured to generate an electric field when an electric current is supplied, and a dielectric layer formed to cover the pair electrodes, wherein the first wiring electrode and the second wiring electrode are formed on an opposite side to the plurality of the pair electrodes with respect to the semiconductor light emitting devices.

18 Claims, 12 Drawing Sheets

(51) Int. Cl.
*H01L 33/62* (2010.01)
*H01L 33/44* (2010.01)
(52) U.S. Cl.
CPC ............... *H01L 2933/0025* (2013.01); *H01L 2933/0066* (2013.01)

(56) References Cited

U.S. PATENT DOCUMENTS

| | | | |
|---|---|---|---|
| 9,181,630 B2 * | 11/2015 | Shibata | H01L 25/0753 |
| 9,412,912 B2 * | 8/2016 | Lin | H01L 24/95 |
| 9,825,202 B2 | 11/2017 | Schuele et al. | |
| 2004/0016717 A1 * | 1/2004 | Fonstad | H01L 21/2007 |
| | | | 216/2 |
| 2005/0009303 A1 * | 1/2005 | Schatz | H01L 24/95 |
| | | | 438/466 |
| 2007/0087472 A1 * | 4/2007 | Huber | B81C 1/00007 |
| | | | 438/106 |
| 2008/0218299 A1 * | 9/2008 | Arnold | B81C 1/00007 |
| | | | 335/306 |
| 2008/0251796 A1 * | 10/2008 | Lee | H01L 27/153 |
| | | | 257/88 |
| 2010/0170086 A1 | 7/2010 | Ramadan et al. | |
| 2010/0192365 A1 | 8/2010 | Chow et al. | |
| 2013/0126081 A1 | 5/2013 | Hu et al. | |
| 2013/0168708 A1 * | 7/2013 | Shibata | H01L 25/0753 |
| | | | 257/88 |
| 2016/0155906 A1 * | 6/2016 | Lin | H01L 24/95 |
| | | | 438/28 |

\* cited by examiner

DISPLAY DEVICE USING SEMICONDUCTOR LIGHT EMITTING DEVICE AND METHOD FOR MANUFACTURING THE SAME

CROSS-REFERENCE TO RELATED APPLICATIONS

This application is a Continuation of PCT International Application No. PCT/KR2018/011453, filed on Sep. 27, 2018, which claims priority under 35 U.S.C. 119(a) to Korean Patent Application No. 10-2018-0045718, filed on Apr. 19, 2018 and Korean Patent Application No. 10-2018-0096299, filed on Aug. 17, 2018, all of which are hereby expressly incorporated by reference into the present application.

BACKGROUND OF THE INVENTION

1. Field of the Invention

The present disclosure relates to a display device and a fabrication method thereof, and more particularly, to a display device using a semiconductor light emitting device.

2. Description of the Related Art

In recent years, liquid crystal displays (LCDs), organic light emitting diode (OLED) displays, and micro LED displays have been competing to implement a large-area display in the field of display technology.

However, there exist problems such as not-so-fast response time, low efficiency of light generated by backlight in case of LCDs, and there exist drawbacks such as short life span, not-so-good yield as well as low efficiency in case of OLEDs.

On the contrary, when semiconductor light emitting devices (micro LED (μLED)) having a diameter or a cross sectional area of 100 microns or less are used in a display, the display can provide a very high efficiency because it does not absorb light using a polarizing plate or the like. However, since a large-sized display requires millions of semiconductor light emitting devices, it has difficulty in transferring the devices compared to other technologies.

Technologies currently in development for transfer processes include pick & place, laser lift-off (LLO), self-assembly, or the like. Among them, the self-assembly method, which is a method in which the semiconductor light emitting device locates themselves in a fluid, is the most advantageous method for realizing a large-sized display device.

In recent years, U.S. Pat. No. 9,825,202 proposed a micro LED structure suitable for self-assembly, but there is not yet research on technologies for fabricating a display through self-assembly of micro LEDs. Accordingly, the present disclosure proposes a new type of display device in which micro LEDs can be self-assembled and a fabrication method thereof.

SUMMARY OF THE INVENTION

An object of the present disclosure is to provide a new fabrication process with high reliability in a large-screen display using micro-sized semiconductor light emitting devices.

Another object of the present disclosure is to provide a fabrication process of a display in which semiconductor light emitting devices can be self-assembled directly on a wiring substrate.

A method of fabricating a display device according to the present disclosure includes assembling epitaxial chips in a fluid only in a region configured with pixels using an electric field and then forming a mesa on a panel, and connecting wiring lines to constitute a display.

More specifically, a fabrication method of the display device can include transferring a substrate to an assembly position, and placing semiconductor light emitting devices having a first conductive semiconductor layer and a second conductive semiconductor layer into a fluid chamber, guiding the movement of the semiconductor light emitting devices in the fluid chamber to assemble the semiconductor light emitting devices at preset positions of the substrate, etching at least one of the first conductive semiconductor layer and the second conductive semiconductor layer while the semiconductor light emitting devices are assembled at the preset positions of the substrate to generate a plurality of semiconductor light emitting devices, and connecting a first wiring electrode and a second wiring electrode to the plurality of semiconductor light emitting devices.

According to an embodiment, the plurality of semiconductor light emitting devices can be provided with magnetic bodies, and guided to preset positions of the substrate by an electric field and a magnetic field.

Said assembly process can include applying a magnetic field to the semiconductor light emitting devices to move the semiconductor light emitting devices along a magnetic force in the fluid chamber, and guiding the semiconductor light emitting devices to the preset positions of the substrate by applying the electric field so as to allow the semiconductor light emitting devices to be placed at the preset positions during the movement of the semiconductor light emitting devices.

The fabrication method of the display device can further include removing the magnetic bodies. The magnetic body can be protruded from one surface of the semiconductor layer to be etched between the first conductive semiconductor layer and the second conductive semiconductor layer.

Furthermore, the present disclosure discloses a method of fabricating a display device, and the method can include forming semiconductor light emitting devices deposited with a magnetic body, a first conductive semiconductor layer, and a second conductive semiconductor layer, transferring a substrate to an assembly position, and placing the semiconductor light emitting devices into a fluid chamber, guiding the movement of the semiconductor light emitting devices in the fluid chamber using a magnetic force, and assembling the semiconductor light emitting devices at preset positions of the substrate using an electric field, removing the magnetic bodies while the semiconductor light emitting devices are assembled at the preset positions of the substrate, etching at least one of the first conductive semiconductor layer and the second conductive semiconductor layer to generate a plurality of semiconductor light emitting devices, and connecting a first wiring electrode and a second wiring electrode to the plurality of semiconductor light emitting devices.

In addition, according to the foregoing method of fabricating a display device, a display device having a new structure will be implemented. More specifically, the display device can include a plurality of semiconductor light emitting devices, a first wiring electrode and a second wiring electrode respectively extended from the semiconductor light emitting devices to supply an electric signal to the semiconductor light emitting devices, a plurality of pair electrodes disposed on the substrate, and provided with a first electrode and a second electrode configured to generate an electric field when an electric current is supplied, and a dielectric layer formed to cover the pair electrodes, wherein the first wiring electrode and the second wiring electrode are formed on an opposite side to the plurality of the pair electrodes with respect to the semiconductor light emitting devices.

According to an embodiment, a passivation layer can be filled between the plurality of semiconductor light emitting devices, and the first wiring electrode and the second wiring electrode can be extended to one surface of the passivation layer.

The passivation layer can have a plurality of cells, and the plurality of semiconductor light emitting devices can be accommodated in the cells.

The passivation layer can be made of a polymer material or an inorganic material, and an electric field generated by the pair electrodes can be formed inside the cells. The plurality of cells can be arranged in a matrix structure, and the plurality of pair electrodes can be extended to neighboring cells. One surface of the passivation layer can be a surface opposite to a surface covering the dielectric layer.

According to an embodiment, the semiconductor light emitting devices can be disposed between the first electrode and the second electrode. The semiconductor light emitting devices can include a first conductive semiconductor layer, and a second conductive semiconductor layer overlapping with the first conductive semiconductor layer, and covering the dielectric layer, and one surface of the second conductive semiconductor layer can be partially covered by the first conductive semiconductor layer.

According to the present disclosure having the foregoing configuration, a large number of semiconductor light emitting devices can be assembled at one time in a display device in which individual pixels are formed with micro light emitting diodes.

As described above, according to the present disclosure, a large number of semiconductor light emitting devices can be pixelated on a wafer having a small size, and then directly transferred onto a large-area substrate. Furthermore, as the mesa of the semiconductor light emitting devices is carried out on a substrate, it is possible to directly transfer the semiconductor light emitting devices to a wiring substrate without using a temporary substrate. Through this, it is possible to fabricate a large-area display device at a low cost.

In addition, according to the fabrication method and device of the present disclosure, semiconductor light emitting devices can be simultaneously transferred to exact positions using a magnetic field and an electric field in a solution, thereby allowing a low cost, high efficiency, and high-speed transfer implementation.

Moreover, since assembly by an electric field is carried out, selective assembly can be allowed through a selective electrical application without any additional device or process. Accordingly, red, green, and blue micro LEDs can be selectively assembled at desired positions.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
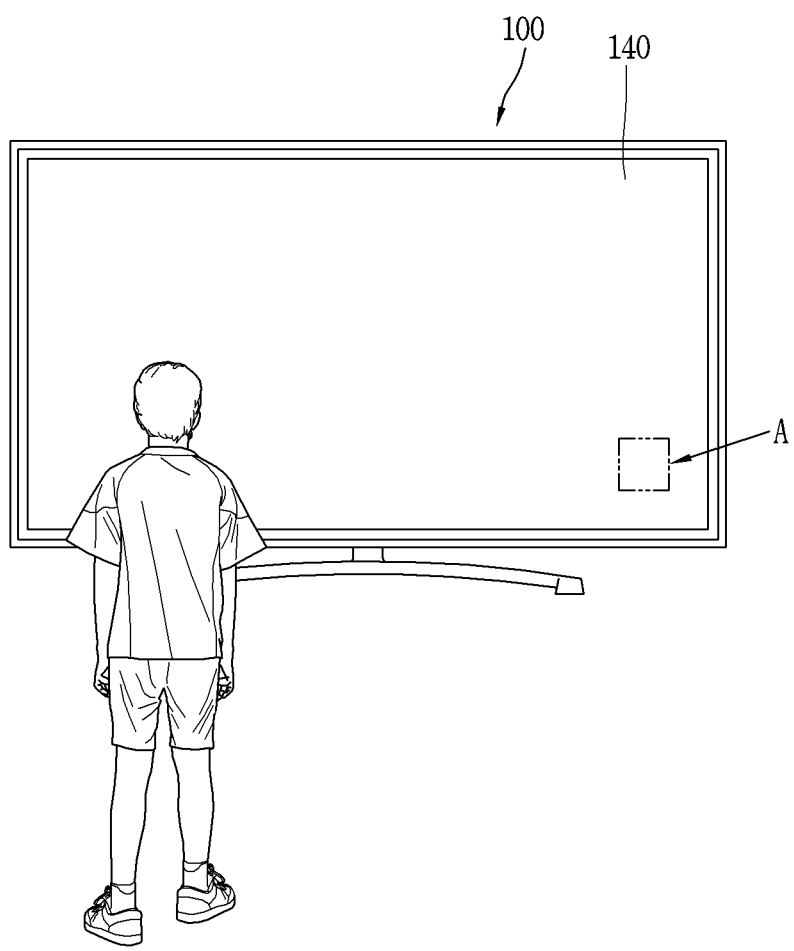
FIG. 1 is a view showing a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element can also be interposed therebetween.

A display device disclosed herein can include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head-mounted display (HMD), a desktop computer, and the like. However, it would be easily understood by those skilled in the art that a configuration disclosed herein can be applicable to any displayable device even though it is a new product type which will be developed later.

Figure 2:
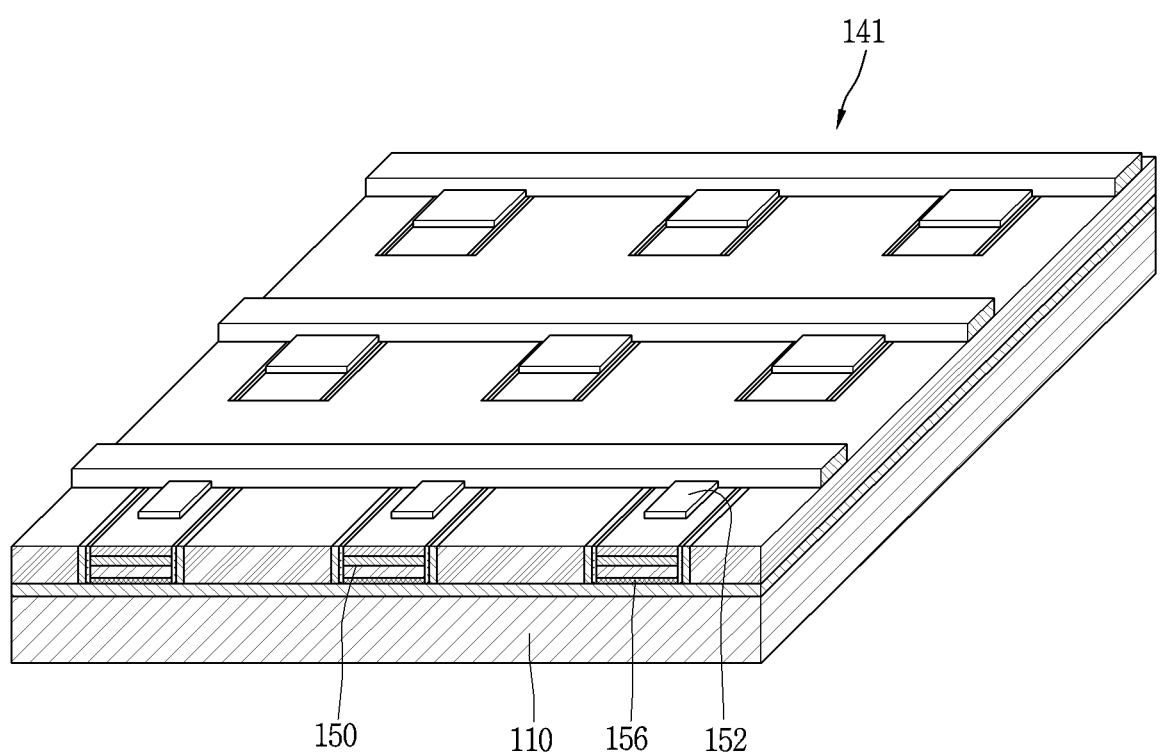
FIG. 2 is a partially enlarged view showing a portion "A" of the display device in FIG. 1.
Figure 3:
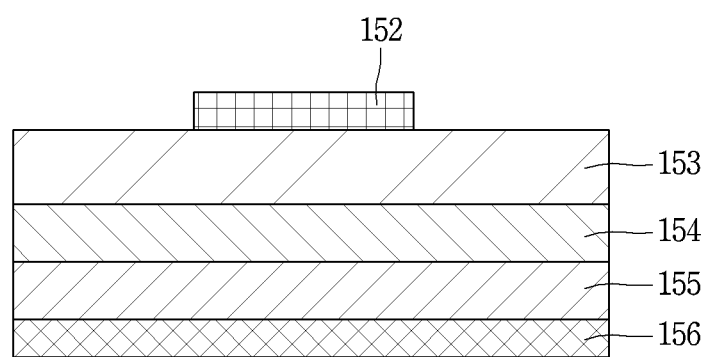
FIG. 3 is an enlarged view showing a semiconductor light emitting device in FIG. 2.
Figure 4:
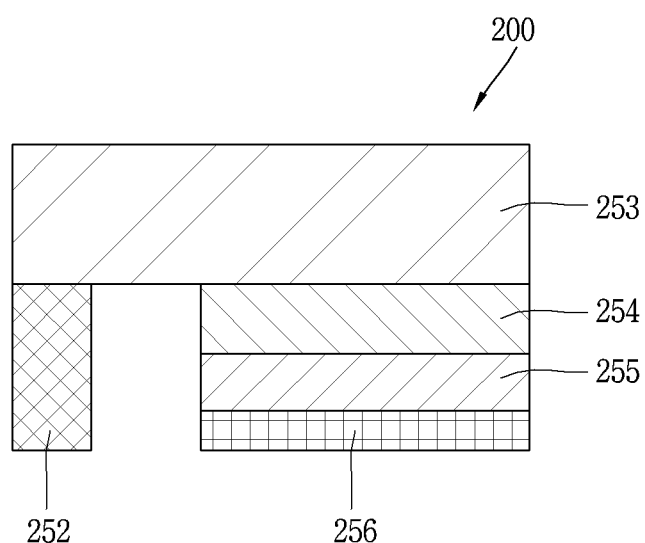
FIG. 4 is an enlarged view showing another embodiment of the semiconductor light emitting device in FIG. 2.

FIG. 1 is a view showing a display device using a semiconductor light emitting device according to an embodiment of the present disclosure, and FIG. 2 is a partially enlarged view showing a portion "A" of the display device in FIG. 1, and FIG. 3 is an enlarged view showing a semiconductor light emitting device in FIG. 2, and FIG. 4 is an enlarged view showing another embodiment of the semiconductor light emitting device in FIG. 2.

According to the illustration, information processed in the controller of the display device 100 can be displayed on a display module 140. A case 101 in the form of a closed loop surrounding an edge of the display module can form a bezel of the display device.

The display module 140 can include a panel 141 on which an image is displayed, and the panel 141 can include micro-sized semiconductor light emitting devices 150 and a wiring substrate 110 on which the semiconductor light emitting devices 150 are mounted.

Wiring lines can be formed on the wiring substrate 110, and connected to an n-type electrode 152 and a p-type electrode 156 of the semiconductor light emitting device 150. Through this, the semiconductor light emitting device 150 can be provided on the wiring substrate 110 as a self-emitting individual pixel.

An image displayed on the panel 141 is visual information, and implemented by independently controlling the light emission of a sub-pixel arranged in a matrix form through the wiring lines.

According to the present invention, a micro LED (Light Emitting Diode) is illustrated as one type of the semiconductor light emitting device 150 that converts current into light. The micro LED can be a light emitting diode formed with a small size of 100 microns or less. The semiconductor light emitting device 150 can be provided in blue, red, and green light emitting regions, respectively, to implement a sub-pixel by a combination of the light emitting regions. In other words, the sub-pixel denotes a minimum unit for implementing a single color, and at least three micro LEDs can be provided in the sub-pixel.

More specifically, referring to FIG. 3, the semiconductor light emitting device 150 can be a vertical structure.

For example, the semiconductor light emitting devices 150 can be implemented with a high-power light emitting device that emits various lights including blue in which gallium nitride (GaN) is mostly used, and indium (In) and or aluminum (Al) are added thereto.

The vertical semiconductor light emitting device can include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom can be electrically connected to a p-electrode of the wiring substrate, and the n-type electrode 152 located at the top can be electrically connected to an n-electrode at an upper side of the semiconductor light emitting device. The electrodes can be disposed in the upward/downward direction in the vertical semiconductor light emitting device 150, thereby providing a great advantage capable of reducing the chip size.

For another example, referring to FIG. 4, the semiconductor light emitting device can be a flip chip type semiconductor light emitting device.

For such an example, the semiconductor light emitting device 250 can include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 can be electrically connected to the p-electrode and the n-electrode of the wiring substrate at the bottom of the semiconductor light emitting device.

The vertical semiconductor light emitting device and the horizontal semiconductor light emitting device respectively can be a green semiconductor light emitting device, a blue semiconductor light emitting device, or a red semiconductor light emitting device. The green semiconductor light emitting device and the blue semiconductor light emitting device can be mostly formed of gallium nitride (GaN), and indium (In) and/or aluminum (Al) can be added thereto to implement a high-power light emitting device that emits green or blue light. For such an example, the semiconductor light emitting device can be a gallium nitride thin-film formed in various layers such as n-Gan, p-Gan, AlGaN, and InGa, and specifically, the p-type semiconductor layer can be p-type GaN, and the n-type semiconductor layer can be N-type GaN. However, in case of the red semiconductor light emitting device, the p-type semiconductor layer can be p-type GaAs and the n-type semiconductor layer can be n-type GaAs.

In addition, a p-electrode side in the p-type semiconductor layer can be p-type GaN doped with Mg, and an n-electrode side in the n-type semiconductor layer can be n-type GaN doped with Si. In this case, the above-described semiconductor light emitting devices can be semiconductor light emitting devices without an active layer.

On the other hand, referring to FIGS. 1 through 4, since the light emitting diode is very small, the display panel can be arranged with self-emitting sub-pixels arranged at fine pitch, thereby implementing a high-quality display device.

In a display device using the semiconductor light emitting device of the present disclosure described above, a semiconductor light emitting device grown on a wafer and formed through mesa and isolation is used as an individual pixel. In this case, the micro-sized semiconductor light emitting device 150 must be transferred to a wafer at a predetermined position on the substrate of the display panel. Pick and place is used for the transfer technology, but the success rate is low and a lot of time is required. For another example, there is a technology of transferring a plurality of devices at one time using a stamp or a roll, but the yield is limited and not suitable for a large screen display. The present disclosure proposes a new fabrication method of a display device capable of solving the foregoing problems and a fabrication device using the same.

For this purpose, first, a new fabrication method of the display device will be described. FIGS. 5A through 5E are views for explaining a new process of fabricating the foregoing semiconductor light emitting device.

In this specification, a display device using a passive matrix (PM) semiconductor light emitting device is illustrated. However, an example described below can also be applicable to an active matrix (AM) type semiconductor light emitting device. In addition, a method using a horizontal semiconductor light emitting device is illustrated, but it is also applicable to a method of self-assembling a vertical semiconductor light emitting device.

First, according to a manufacturing method, a first conductive semiconductor layer 253, an active layer 254, and a second conductive semiconductor layer 255 are respectively grown on a growth substrate 259.

Figure 5A:
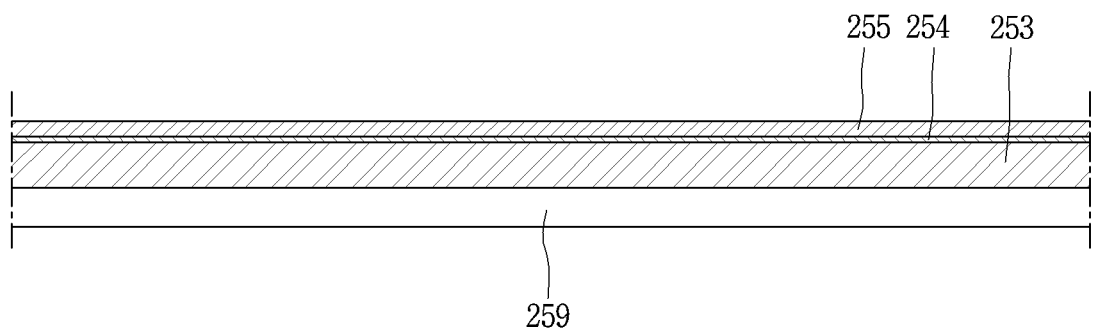
FIGS. 5A through 5E are views for explaining a new process of fabricating the foregoing semiconductor light emitting device.

When the first conductive semiconductor layer 253 is grown, next, the active layer 254 is grown on the first conductive semiconductor layer 253, and then the second conductive semiconductor layer 255 is grown on the active layer 1154. As described above, when the first conductive semiconductor layer 253, the active layer 254 and the second conductive semiconductor layer 255 are sequentially grown, the first conductive semiconductor layer 253, the active layer 254, and the second conductive semiconductor layer 255 form a layer structure as illustrated in FIG. 5A.

In this case, the first conductive semiconductor layer 253 can be an n-type semiconductor layer, and the second conductive semiconductor layer 255 can be a p-type semiconductor layer. However, the present disclosure is not limited thereto, and the first conductive type can be p-type and the second conductive type can be n-type.

In addition, the present embodiment illustrates a case where the active layer is present, but it is also possible to adopt a structure in which the active layer is not present as described above. For such an example, the p-type semiconductor layer can be p-type GaN doped with Mg, and an n-electrode side in the n-type semiconductor layer can be n-type GaN doped with Si.

The growth substrate 259 (wafer) can be formed of any one of materials having light transmission properties, for example, sapphire ($Al_2O_3$), GaN, ZnO, and AlO, but is not limited thereto. Furthermore, the growth substrate 259 can be formed of a carrier wafer, which is a material suitable for semiconductor material growth. The growth substrate 229 can be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga2O_3$ can be used.

Figure 5B:
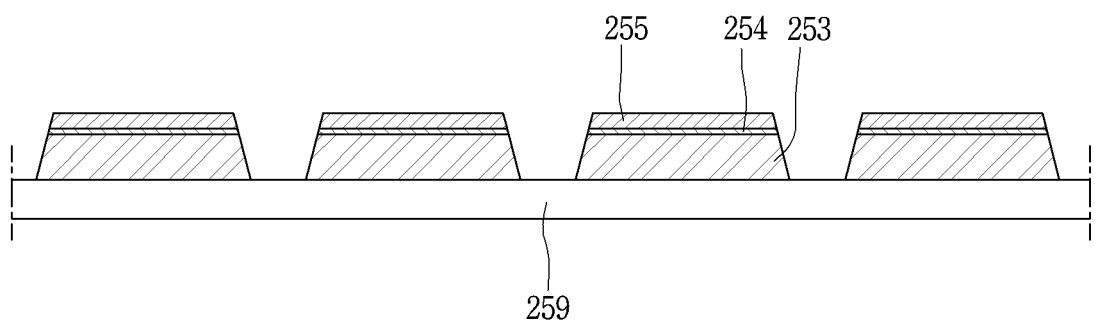

Next, at least part of the first conductive semiconductor layer 253, the active layer 254 and the second conductive semiconductor layer 255 is removed to form a plurality of epi chips of the semiconductor light emitting devices (FIG. 5B).

More specifically, isolation is carried out so that a plurality of light emitting devices form an array with epi chips. In other words, the first conductive semiconductor layer 253, the active layer 254, and the second conductive semiconductor layer 255 are etched in a vertical direction to form a plurality of semiconductor light emitting devices.

If the horizontal semiconductor light emitting device is formed at this stage, then the active layer 254 and the second conductive semiconductor layer 255 can be partially removed in a vertical direction to perform a mesa process in which the first conductive semiconductor layer 253 is exposed to the outside, and then isolation in which the first conductive semiconductor layer is etched to form a plurality of semiconductor light emitting device arrays. However, according to the present disclosure, since the mesa process is carried out subsequent to self-assembly, the isolation process is carried out without the mesa process in the present stage. In this case, the semiconductor light emitting device can be isolated to a circular size of 100 μm or less in diameter.

Figure 5C:
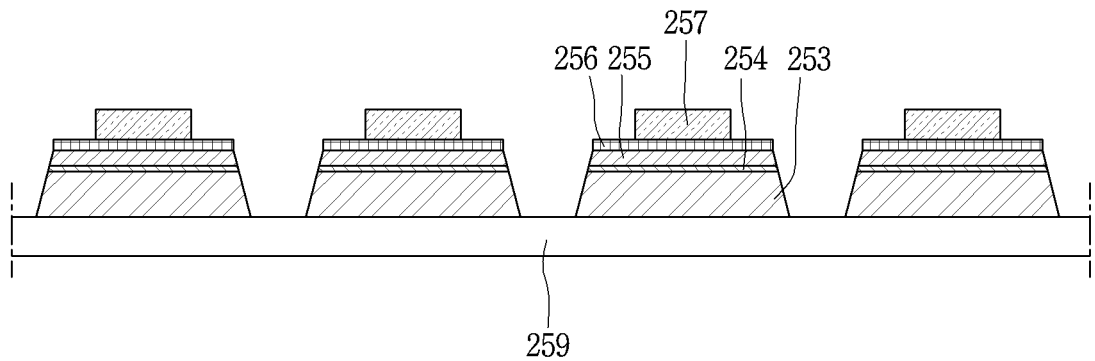

Next, a second conductive electrode 256 (or a p-type electrode) is formed on one surface of the second conductive semiconductor layer 255 (FIG. 5C). The second conductive electrode 256 can be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 256 can also be an n-type electrode.

Then, a magnetic body 257 is laminated on the second conductive electrode 256. The magnetic body 257 can refer to a metal having a magnetic property formed on an epi chip. The magnetic body can be Ni, Sn, Fe, Co or the like, and for another example, a material corresponding to at least one of Gd-based, La-based, and Mn-based materials.

The magnetic body 257 can serve as a post for upper and lower division at the time of self-assembly afterward, and can have an area of 25 to 75% of the area of the epi chip and a height of several hundred nanometers to several micrometers. However, the present disclosure is not limited thereto, and the magnetic body can be provided in the second conductive electrode 256 in the form of particles. Furthermore, alternatively, for a conductive electrode including a magnetic body, a single layer of the conductive electrode can be made of a magnetic body. For such an example, the second conductive electrode 256 can include a first layer on the inner side and a second layer on the outer side. Here, the first layer can be made to include a magnetic body, and the second layer can include a metal material other than a magnetic body.

Figure 5D:
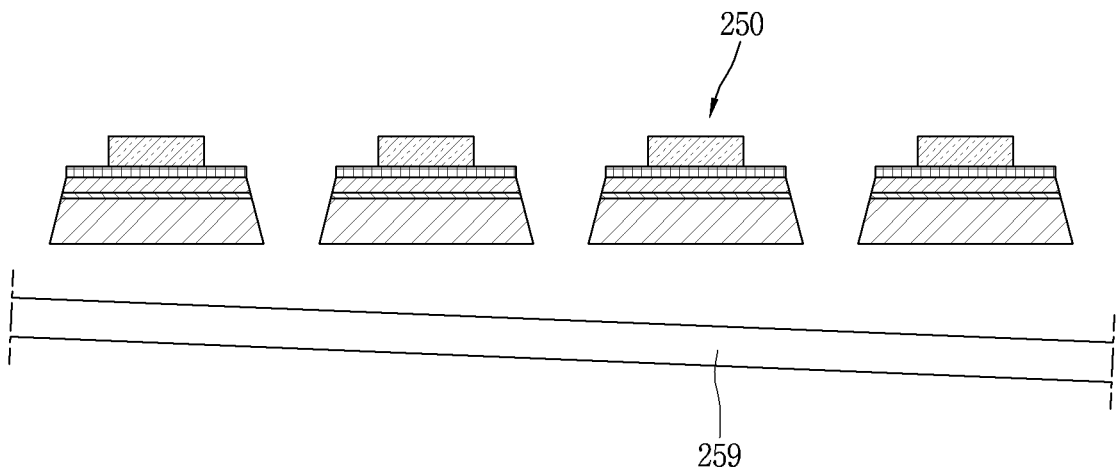

Then, the growth substrate 259 is removed to provide a plurality of semiconductor light emitting devices 250. For example, the growth substrate 259 can be removed using a laser lift-off (LLO) or chemical lift-off (CLO) method (FIG. 5D).

Figure 5E:
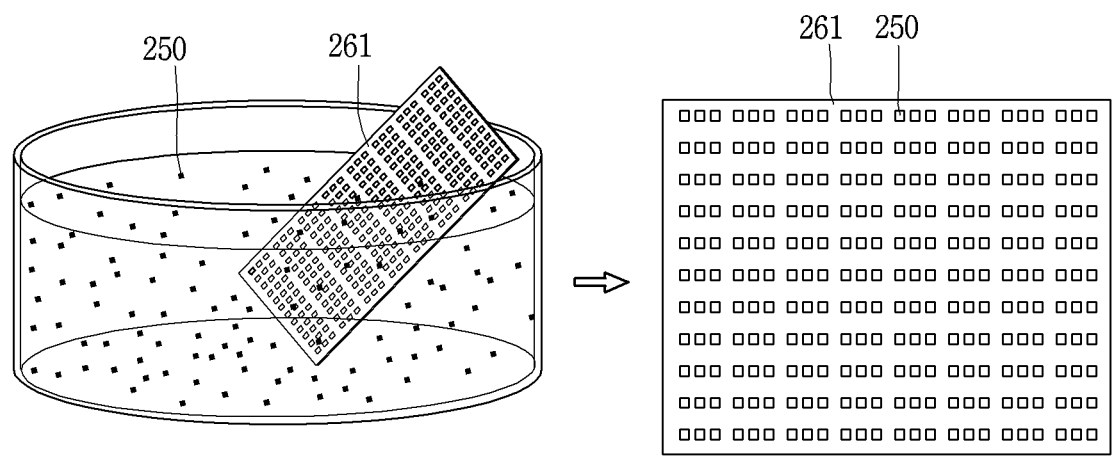

However, at this stage, the plurality of semiconductor light emitting devices 250 do not have a completed structure as an epi chip in a subsequent process. Then, the process of mounting the plurality of semiconductor light emitting devices 250 on the substrate in a chamber filled with a fluid (FIG. 5E).

For example, the semiconductor light emitting devices 250 and the substrate are placed in a chamber filled with a fluid, and the semiconductor light emitting devices 250 are assembled to the substrate by themselves using flow, gravity, surface tension, or the like.

In the present disclosure, the substrate can be a wiring substrate 261. In other words, the wiring substrate 261 is placed in the fluid chamber so that the semiconductor light emitting devices 250 are directly mounted on the wiring substrate 261.

Meanwhile, the self-assembly method described above must increase transfer yield when applied to the fabrication of a large-screen display. The present disclosure proposes a method and device for increasing transfer yield.

In this case, in a display device according to the present disclosure, a magnetic force is applied to the magnetic body in the semiconductor light emitting device to move the semiconductor light emitting device, and places the semiconductor light emitting device at preset positions using an electric field in the movement process. Hereinafter, such a transfer method and device will be described in more detail with reference to the accompanying drawings.

Figure 6:
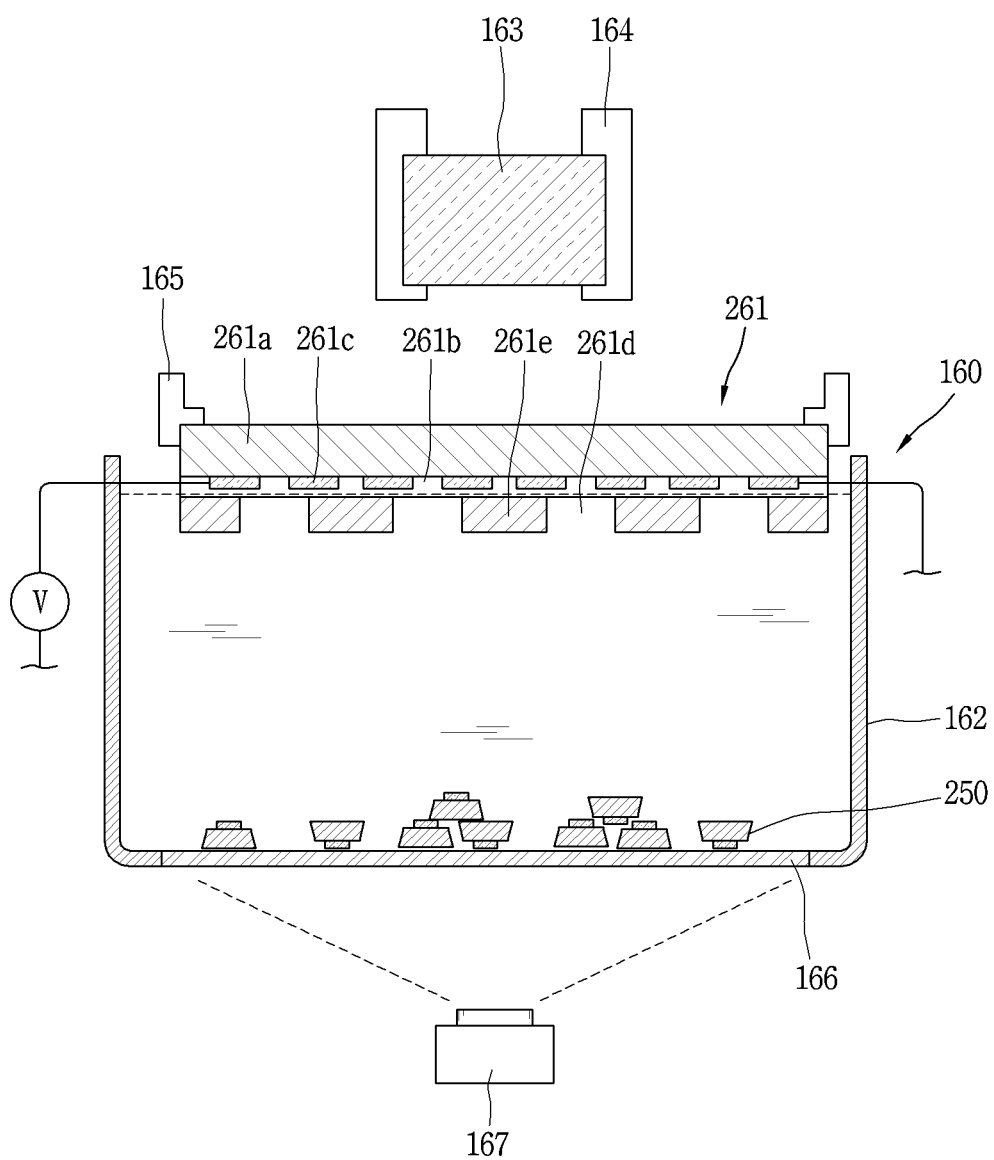
FIG. 6 is a view showing an example of a self-assembly device of semiconductor light emitting devices according to the present disclosure.
Figure 7:
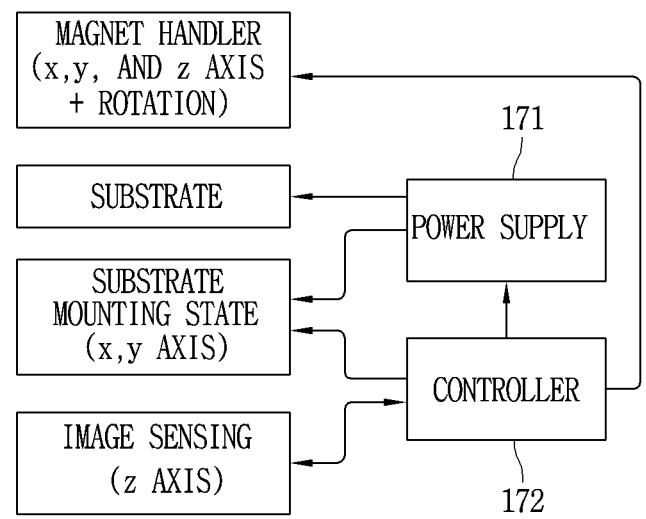
FIG. 7 is a block diagram showing the self-assembly device in FIG. 6.

FIG. 6 is a view showing an example of a self-assembly device of semiconductor light emitting devices according to the present invention, and FIG. 7 is a block diagram showing the self-assembly device in FIG. 6. Furthermore, FIGS. 8A through 8G are views showing a process of self-assembling semiconductor light emitting devices using the self-assembly device in FIG. 6.

According to the illustration of FIGS. 6 and 7, a self-assembly device 160 of the present disclosure can include a fluid chamber 162, a magnet 163, and a location controller 164.

The fluid chamber 162 has a space for accommodating a plurality of semiconductor light emitting devices. The space can be filled with a fluid, and the fluid can include water or the like as an assembly solution. Accordingly, the fluid chamber 162 can be a water tank, and can be configured with an open type. However, the present disclosure is not limited thereto, and the fluid chamber 162 can be a closed type in which the space is formed with a closed space.

The substrate 261 can be disposed on the fluid chamber 162 such that an assembly surface on which the semiconductor light emitting devices 250 are assembled faces downward. For example, the substrate 261 can be transferred to an assembly position by a transfer unit, and the transfer unit can include a stage 165 on which the substrate is mounted. The stage 165 is positioned by the controller, and the substrate 261 can be transferred to the assembly position through the stage 165.

At this time, the assembly surface of the substrate 261 faces the bottom of the fluid chamber 162 at the assembly position. According to the illustration, the assembly surface of the substrate 261 is disposed so as to be immersed in a fluid in the fluid chamber 162. Therefore, the semiconductor light emitting devices 250 are moved to the assembly surface in the fluid.

The substrate 261, which is an assembly substrate on which an electric field can be formed as well as a wiring substrate on which wiring lines are formed afterward, can include a base portion 261a, a dielectric layer 261b, a plurality of electrodes 261c and a plurality of cells 261d.

The base portion 261a can be made of an insulating material, and the plurality of electrodes 261c can be a thin or a thick film bi-planar electrode patterned on one side of the base portion 261a. The electrode 261c can be formed of, for example, a laminate of Ti/Cu/Ti, an Ag paste, ITO, and the like.

More specifically, the electrode 261c can be a plurality of pair electrodes disposed on the substrate and provided with a first electrode and a second electrode that generate an electric field when an electric current is supplied.

The dielectric layer 261b is made of an inorganic material such as $SiO_2$, SiNx, SiON, $Al_2O_3$, $TiO_2$, $HfO_2$, or the like. Alternatively, the dielectric layer 261b can be composed of a single layer or multiple layers as an organic insulator. A thickness of the dielectric layer 261b can be several tens of nanometers to several micrometers.

Furthermore, the wiring substrate 261 according to the present disclosure includes a plurality of cells 261d partitioned by partition walls 261e.

For example, the wiring substrate 261 can be provided with cells 261d through which the semiconductor light emitting devices 250 are inserted so that the semiconductor light emitting devices 250 can easily be mounted on the wiring substrate 261 Specifically, cells 261d on which the semiconductor light emitting devices 250 are mounted are formed on the wiring substrate 261 at positions where the semiconductor light emitting devices 250 are aligned with the wiring electrodes. The semiconductor light emitting devices 250 are assembled into the cells 261d while moving in the fluid.

The cells 261d are sequentially arranged along one direction, and the partition walls 261e constituting the cells 261d are shared with the neighboring cells 261d. In this case, the partition walls 261e can be made of a polymer material. Furthermore, the partition walls 261e are protruded from the base portion 261a, and the cells 261d can be sequentially arranged along one direction by the partition walls 261e. More specifically, the cells 261d are sequentially arranged in row and column directions, and can have a matrix structure.

As shown in the drawing, an inside of the cells 261d has a groove for accommodating the semiconductor light emitting device 250, and the groove can be a space defined by the partition walls 261e. The shape of the groove can be the same as or similar to that of the semiconductor light emitting device. For example, when the semiconductor light emitting device is in a rectangular shape, the groove can be a rectangular shape. In addition, although not shown, when the semiconductor light emitting device is circular, the grooves formed in the cells can be formed in a circular shape. Moreover, each of the cells is configured to accommodate a single semiconductor light emitting device. In other words, a single semiconductor light emitting device is accommodated in a single cell.

On the other hand, according to the present disclosure, a material same as that of the partition walls 261e can be filled inside the cells 261d by a subsequent process. Accordingly, the partition walls 261e can be modified into a passivation layer surrounding the semiconductor light emitting devices. This will be described later.

On the other hand, a plurality of electrodes can be disposed on the substrate, and have a first electrode and a second electrode that generate an electric field when an electric current is supplied, and the first electrode and the second electrode can be referred to as a pair electrode 261c. In the present disclosure, a plurality of the pair electrodes 261c can be provided, and disposed at the bottom of each of the cells 261d. The first electrode and the second electrode can be formed of electrode lines, and the plurality of electrode lines can be extended to neighboring cells.

The pair electrodes 261c are disposed below the cells 261d and applied with different polarities to generate an electric field in the cells 261d. In order to form the electric field, the dielectric layer can form the bottom of the cells 261d while the dielectric layer covers the pair electrodes 261c. In such a structure, when different polarities are applied to the pair electrode 261c from a lower side of each cell 261d, an electric field can be formed, and the semiconductor light emitting device can be inserted into the cells 261d by the electric field.

At the assembly position, the electrodes of the substrate 261 are electrically connected to the power supply unit 171. The power supply unit 171 applies power to the plurality of electrodes to generate the electric field.

According to the illustration, the self-assembly device can include a magnet 163 for applying a magnetic force to the semiconductor light emitting devices. The magnet 163 is spaced apart from the fluid chamber 162 to apply a magnetic force to the semiconductor light emitting devices 250. The magnet 163 can be disposed to face an opposite side of the assembly surface of the substrate 261, and the location of the magnet is controlled by the location controller 164 connected to the magnet 163. The semiconductor light emitting device 250 can have a magnetic body so as to move in the fluid by the magnetic field of the magnet 163.

Referring to FIGS. 6 and 7, more specifically, the self-assembly device can include a magnet handler that can be automatically or manually moved in the x, y, and z axes on the top of the fluid chamber or include a motor capable of rotating the magnet 163. The magnet handler and the motor can constitute the location controller 164. Through this, the magnet 163 rotates in a horizontal direction, a clockwise direction, or a counterclockwise direction with respect to the substrate 161.

On the other hand, a light transmitting bottom plate 166 can be formed in the fluid chamber 162, and the semiconductor light emitting devices can be disposed between the bottom plate 166 and the substrate 161. An image sensor 167 can be positioned to view the bottom plate 166 so as to monitor an inside of the fluid chamber 162 through the bottom plate 166. The image sensor 167 is controlled by the controller 172, and can include an inverted type lens, a CCD, and the like to observe the assembly surface of the substrate 261.

The self-assembling apparatus described above is configured to use a combination of a magnetic field and an electric field, and using those fields, the semiconductor light emitting devices can be placed at preset positions of the substrate by an electric field in the process of being moved by a location change of the magnet. Such a new fabrication method can be a detailed example of the self-assembly method described above with reference to FIG. 5E. Hereinafter, an assembly process using the self-assembly device described above will be described in more detail.

First, a plurality of semiconductor light emitting devices 250 having magnetic bodies are formed through the process described with reference to FIGS. 5A through 5D. In this case, a magnetic body can be deposited on the semiconductor light emitting device in the process of forming the second conductive electrode in FIG. 5C.

Figure 8A:
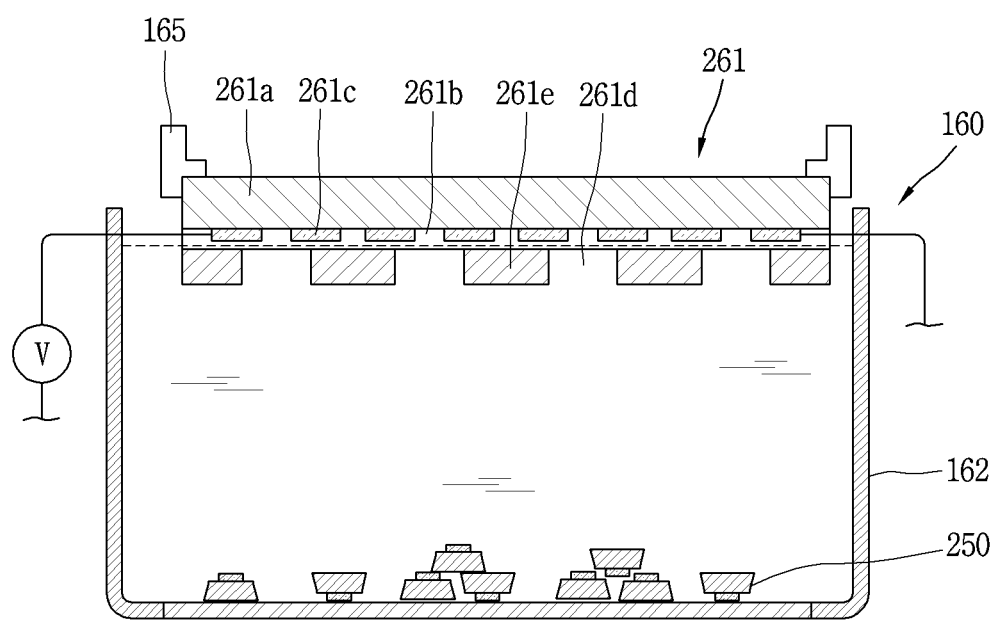
FIGS. 8A through 8G are views showing a process of self-assembling semiconductor light emitting devices using the self-assembly device in FIG. 6.

Next, the substrate 261 is transferred to the assembly position, and the semiconductor light emitting devices 250 are put into the fluid chamber 162 (FIG. 8A).

As described above, the assembly position of the substrate 261 is a position at which the assembly surface on which the semiconductor light emitting devices 250 of the substrate 261 are assembled is disposed in a downward direction in the fluid chamber 162.

In this case, some of the semiconductor light emitting devices 250 can sink to the bottom of the fluid chamber 162 and some can float in the fluid. When the light transmitting bottom plate 166 is provided in the fluid chamber 162, some of the semiconductor light-emitting devices 250 can sink to the bottom plate 166.

Figure 8B:
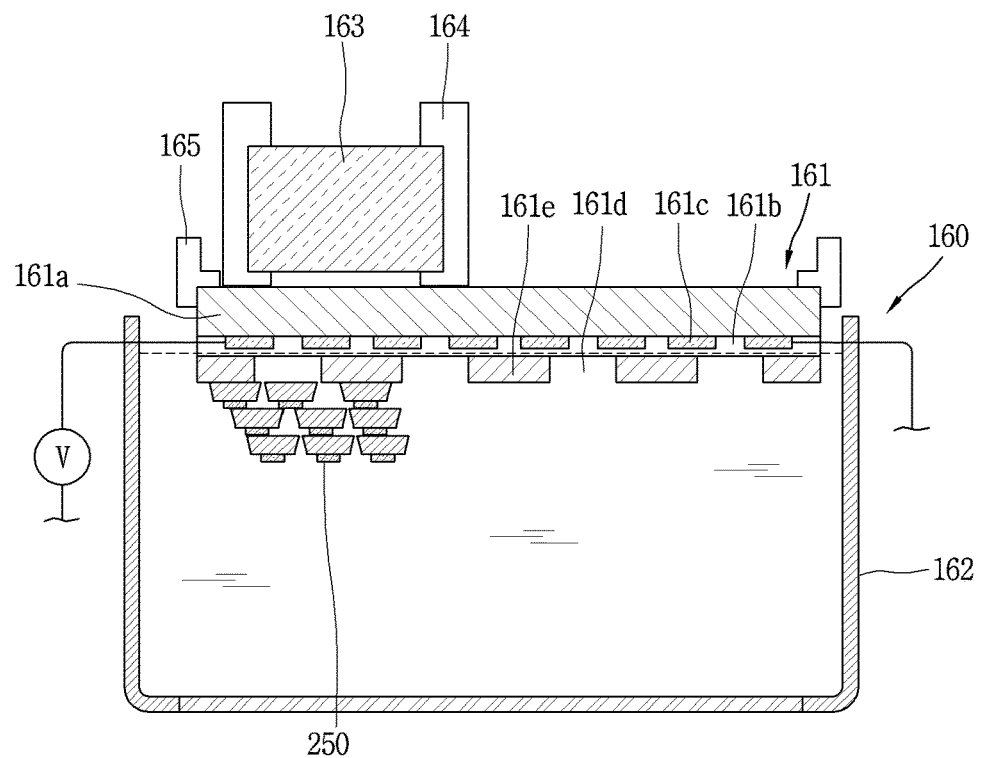

Next, a magnetic force is applied to the semiconductor light emitting devices 250 so that the semiconductor light emitting devices 250 float in the fluid chamber 162 in a vertical direction (FIG. 8B).

When the magnet 163 of the self-assembly device moves from its original position to an opposite side of the assembly surface of the substrate 261, the semiconductor light emitting devices 250 float in the fluid toward the substrate 261. The original position can be a position away from the fluid chamber 162. For another example, the magnet 163 can be composed of an electromagnet. In this case, electricity is supplied to the electromagnet to generate an initial magnetic force.

Meanwhile, in this example, a separation distance between the assembly surface of the substrate 261 and the semiconductor light emitting devices 250 can be controlled by adjusting the magnitude of the magnetic force. For example, the separation distance is controlled using the weight, buoyancy, and magnetic force of the semiconductor light emitting devices 250. The separation distance can be several millimeters to tens of micrometers from the outermost edge of the substrate.

Figure 8C:
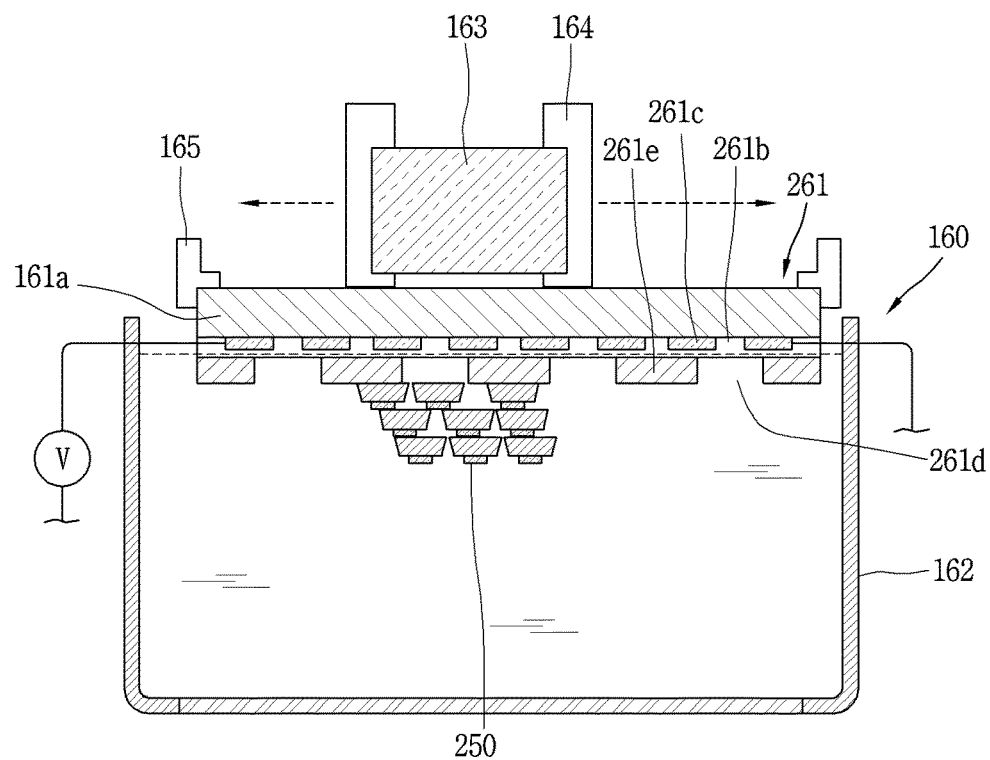

Next, a magnetic force is applied to the semiconductor light emitting devices 250 so that the semiconductor light emitting devices 250 move in one direction in the fluid chamber 162. For example, the magnet 163 moves in a horizontal direction, a clockwise direction or a counter-clockwise direction with respect to the substrate (FIG. 8C). In this case, the semiconductor light emitting devices 250 move in a direction parallel to the substrate 161 at a position spaced apart from the substrate 161 by the magnetic force.

Figure 8D:
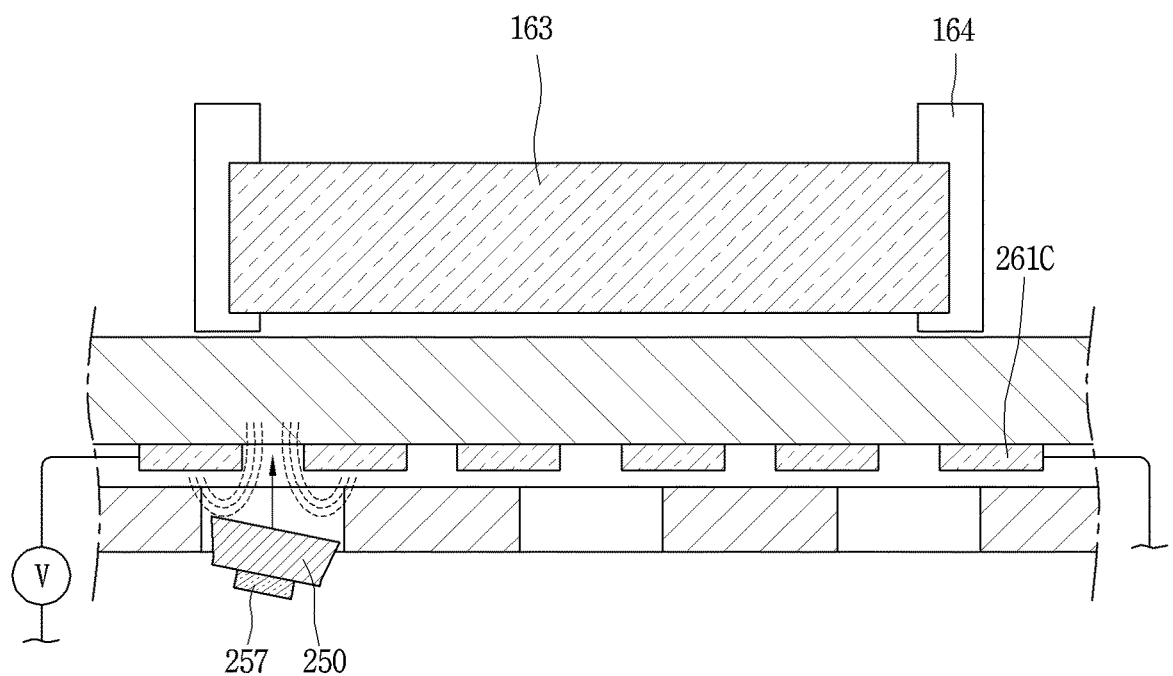

Next, the process of applying an electric field to guide the semiconductor light emitting devices 250 to preset positions of the substrate 161 so as to allow the semiconductor light emitting devices 250 to be placed at the preset positions during the movement of the semiconductor light emitting devices 250 is carried out (FIG. 8D). The semiconductor light emitting devices 250 move in a direction perpendicular to the substrate 261 by the electric field to be placed on the preset positions while moving along a direction parallel to the substrate 161.

The plurality of semiconductor light emitting devices are guided to preset positions of the substrate by an electric field and a magnetic field.

More specifically, electric power is supplied to a pair electrode, that is, a bi-planar electrode of the substrate 261 to generate an electric field, and assembly is carried out only at preset positions. In other words, the semiconductor light emitting devices 250 are assembled to the assembly position of the substrate 261 using a selectively generated electric field. For this purpose, the substrate 261 can include cells in which the semiconductor light emitting devices 250 are inserted.

At this time, the magnetic body 257 of the semiconductor light emitting devices 250 serves as a post for upper and lower division. Specifically, when a surface having the magnetic body 257 is inserted into the cell in a direction toward the pair electrode 261c, the semiconductor light emitting device is unable to be placed on the bottom of the cell (an outer surface of the dielectric layer) by the magnetic body 257.

Figure 8E:
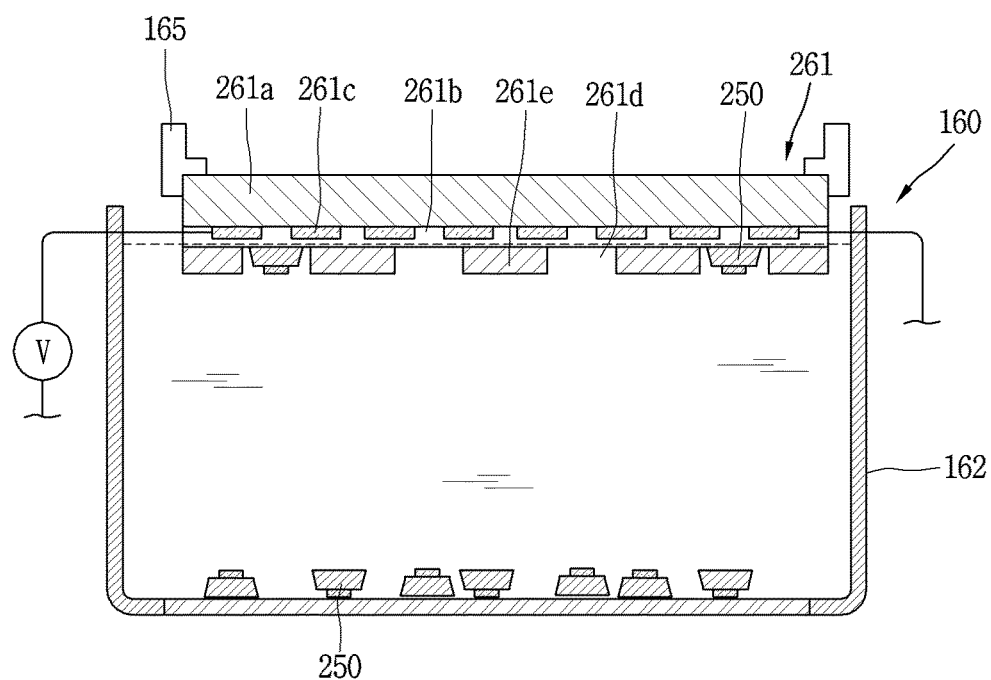

On the other hand, the semiconductor light emitting devices 250 can be guided to the preset positions, then the magnet 163 can move in a direction away from the substrate 261 such that the semiconductor light emitting devices 250 remaining in the fluid chambers 162 fall to the bottom of the fluid chambers 162, (FIG. 8E). For another example, if power supply is stopped when the magnet 163 is an electromagnet, then the semiconductor light emitting devices 250 remaining in the fluid chamber 162 fall to the bottom of the fluid chamber 162.

Then, when the semiconductor light emitting devices 250 on the bottom of the fluid chamber 162 are collected, the collected semiconductor light emitting devices 250 can be reused.

When the display device of the present disclosure uses blue semiconductor light emitting devices, that is, when the semiconductor light emitting devices are all blue semiconductor light emitting devices, the blue semiconductor light emitting devices can be assembled in all the cells of the substrate.

On the other hand, according to this example, each of the red semiconductor light emitting device, the green semiconductor light emitting device, and the blue semiconductor light emitting device can be arranged at a desired position. If the foregoing semiconductor light emitting device 250 is a blue semiconductor light emitting device, then the assembly process described with reference to FIGS. 8A through 8E can generate an electric field only in a cell corresponding to a blue pixel to assemble the blue semiconductor light emitting device at a corresponding position.

Figure 8F:
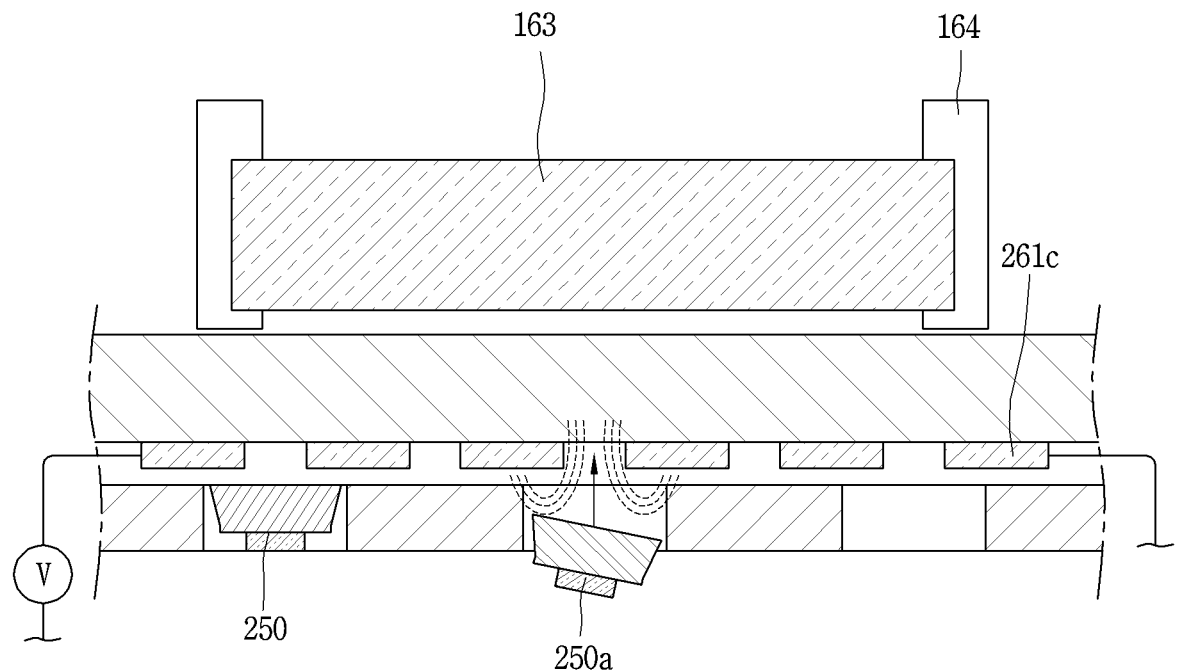
Figure 8G:
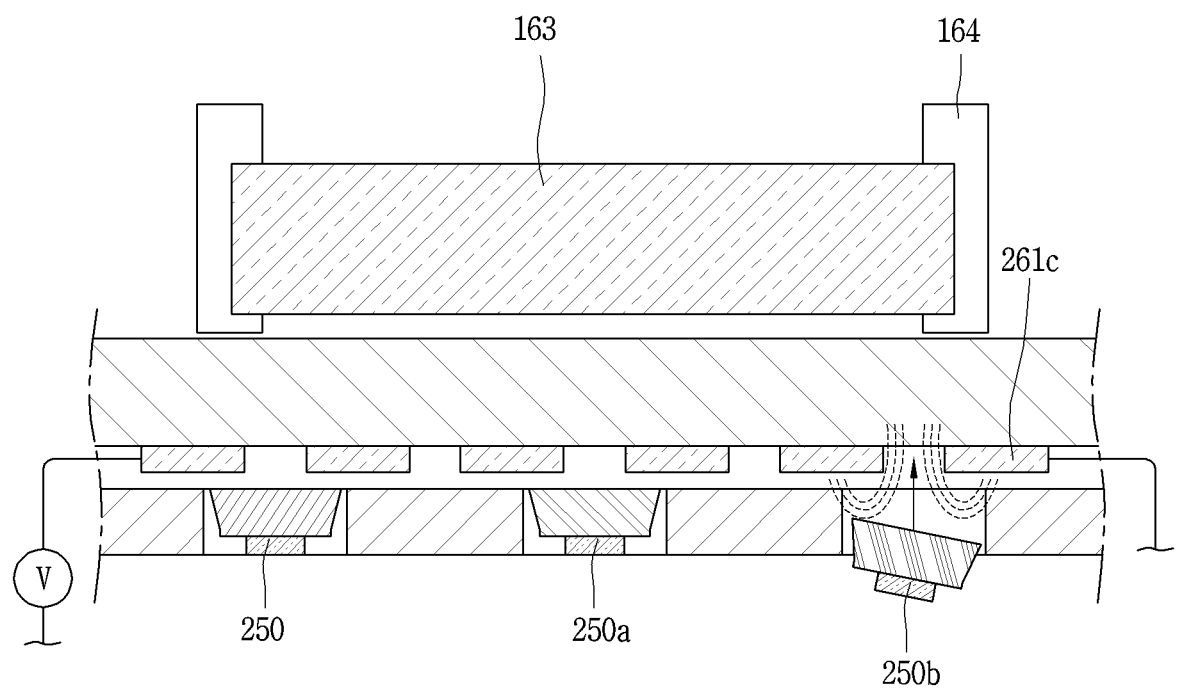

Then, the assembly process described with reference to 8A through 8E are carried out using the green semiconductor light emitting device 250a and the red semiconductor light emitting device 250b, respectively (FIGS. 8F and 8G). However, since the wiring substrate 261 is already loaded at the assembly position, the process of loading the substrate into the assembly position can be omitted.

Then, the process of unloading the wiring substrate 261 is carried out, and the assembly process is completed.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

Furthermore, the blue semiconductor light emitting device, the green semiconductor light emitting device, and the red semiconductor light emitting device can be assembled at desired positions, respectively.

As described above, according to the present disclosure having the foregoing configuration, a large number of semiconductor light emitting devices can be assembled at one time in a display device in which individual pixels are formed with semiconductor light emitting devices.

When the assembly process is completed as described above, a process of fabricating a display device can be carried out. Hereinafter, a fabrication process of such a display device will be described in detail with reference to the drawings.

FIGS. 9A through 9E are views showing a process of fabricating a display device after self-assembling semiconductor light emitting devices on a wiring substrate using the self-assembly device in FIG. 6.

Figure 9A:
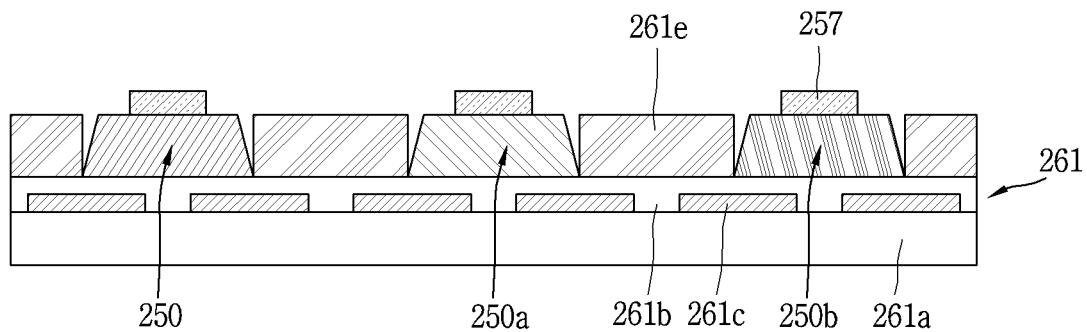
FIGS. 9A through 9E are views showing a process of fabricating a display device after self-assembling semiconductor light emitting devices on a wiring substrate using the self-assembly device in FIG. 6.
Figure 9B:
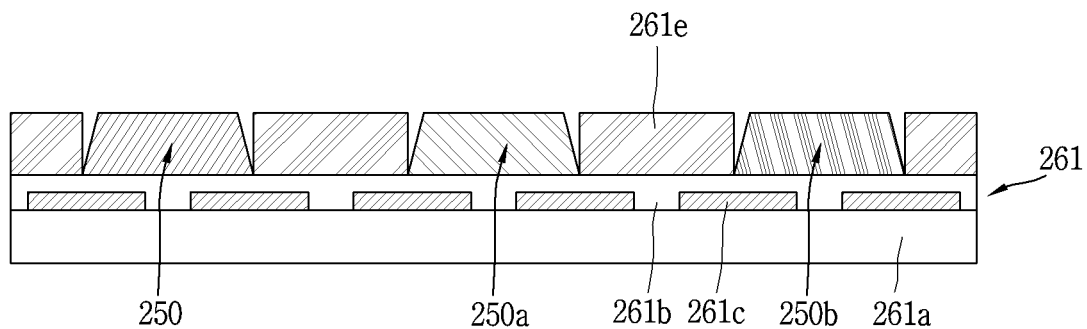

The movement of the semiconductor light emitting devices in the fluid chamber are guided, and the semiconductor light emitting devices are assembled at preset positions of the substrate by the foregoing process, and then the magnetic bodies 257 of the semiconductor light emitting device are removed while the semiconductor light emitting devices 250, 250a, 250b are assembled at the preset positions of the substrate 261 (FIGS. 9A and 9B).

While the blue semiconductor light emitting device 250, the green semiconductor light emitting device 250a, and the red semiconductor light emitting device 250b are sequentially arranged along one direction as shown in FIG. 9A, the magnetic bodies 257 provided in the blue semiconductor light emitting device 250, the green semiconductor light emitting device 250a, and the red semiconductor light emitting device 250b are removed as shown in FIG. 9B.

The removal of the magnetic body 257 can be carried out by a chemical or physical method, and through this, the second conductive electrode 256 (see FIG. 5B) can be exposed to an outside of the cell. On the other hand, the semiconductor light emitting device can have a structure in which a magnetic body is protruded from the second conductive semiconductor layer 255 (see FIG. 5B) without the second conductive electrode 256, and in this case, the second conductive semiconductor layer 255) can be exposed to an outside of the cell.

Figure 9C:
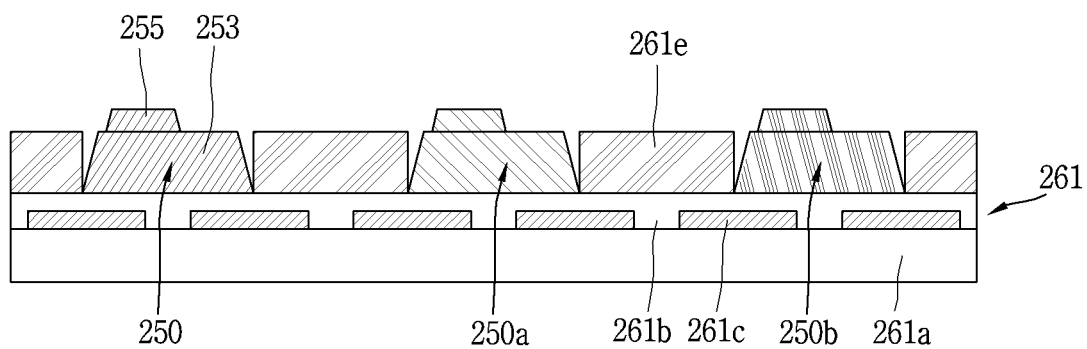

Next, a mesa formation process can be carried out while the semiconductor light emitting devices are assembled at preset positions of the substrate (FIG. 9C).

For example, in order to generate the plurality of semiconductor light emitting devices, at least one of the first conductive semiconductor layer 253 and the second conductive semiconductor layer 255 is etched while the semiconductor devices are assembled at preset positions of the substrate.

More specifically, the second conductive semiconductor layer 255 facing an outside of the cell is etched, and in this case, the second conductive electrode 256 and the active layer 255 (hereinafter, see FIG. 5B) can also be etched together. For another example, in the case where a magnetic body is directly formed on one surface of the conductive semiconductor layer without the second conductive electrode 256, the magnetic body can be protruded from one surface of the semiconductor layer to be etched between the first conductive semiconductor layer 253 and the second conductive semiconductor layer 255. In embodiments, the magnetic body can perform as an etch resist for the semiconductor layer that hosts the magnetic body.

Part of a surface opposite to a surface in contact with the dielectric layer on the first conductive semiconductor layer 253 can be exposed to the outside through etching. A portion exposed to the outside need not be overlapped with an upper surface of the second conductive semiconductor layer 255, and can be a portion spaced apart in a horizontal direction. By such a mesa process, a flip-chip type semiconductor light emitting device is formed.

Figure 9D:
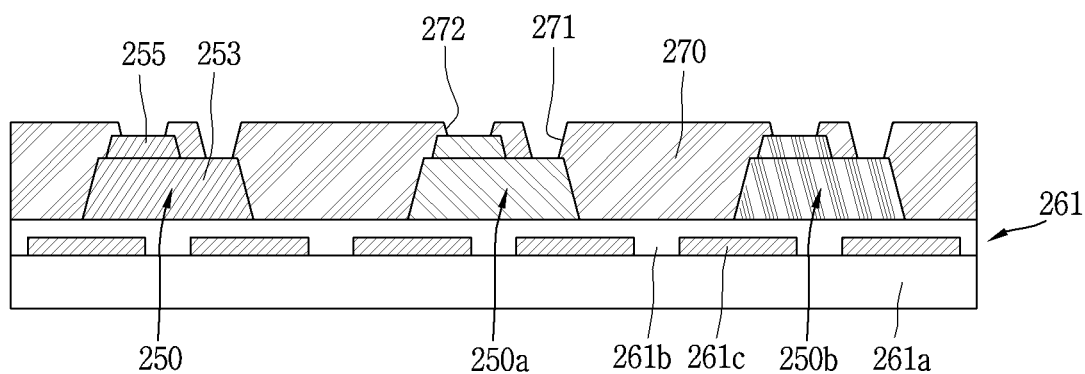

Next, the process of forming a passivation layer, performing planarization, and forming a contact hole is carried out (FIG. 9D).

According to the illustration, a passivation layer 270 can be filled between the plurality of semiconductor light emitting devices. More specifically, as described above, the wiring substrate 261 includes a plurality of cells 261d partitioned by partition walls, and a gap exists between the cell and the semiconductor light emitting device. The passivation layer 270 fills the gap while covering the semiconductor light emitting device together with the partition walls.

Through such a process, a structure in which the passivation layer 270 surrounds the semiconductor light emitting device can be formed on the display. In this case, the passivation layer 270 can be made of a polymer material so as to be integrated with the partition walls.

In the display device shown in FIG. 9D implemented by the above process, the passivation layer 270 can include a plurality of cells, and the plurality of semiconductor light emitting devices can be accommodated in the cells. In other words, the cells that have been provided in the self-assembly process in the final structure are changed into the internal spaces of the passivation layer 270. In this case, an electric field generated by the pair electrodes 261c described with reference to FIG. 9D as described above can be formed inside the cells. In addition, the plurality of cells are arranged in a matrix structure, and the plurality of the pair electrodes 261c have a structure extended to neighboring cells.

Then, a planarization process is carried out to planarize a top surface of the passivation layer 270, and contact holes 271, 272 for wiring lines can be formed. The contact holes 271, 272 can be formed in the first conductive semiconductor layer 253 and the second conductive semiconductor layer 255, respectively.

Figure 9E:
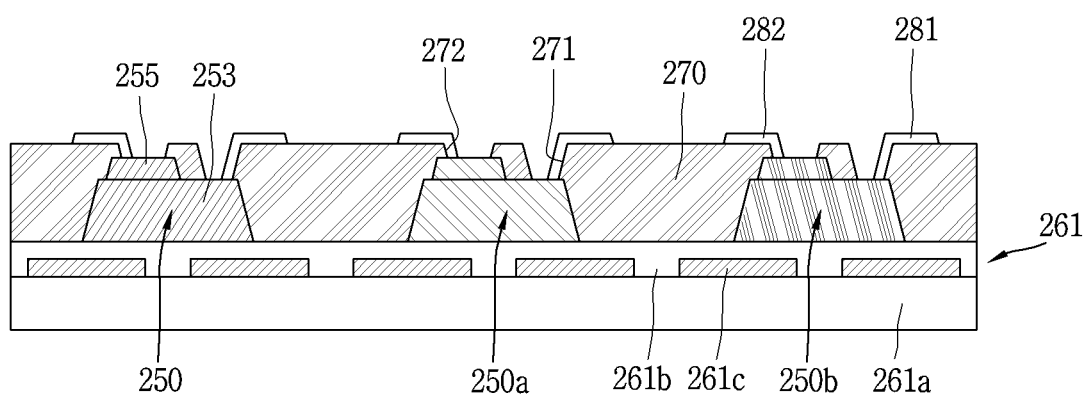

Finally, the first wiring electrodes and the second wiring electrodes are connected to the plurality of semiconductor light emitting devices through the contact holes (FIG. 9E).

According to the illustration of FIG. 9E, the first wiring electrode 281 and the second wiring electrode 282 can be extended to one surface of the passivation layer 270. At this time, one surface of the passivation layer 270 can be a surface opposite to a surface covering the dielectric layer 261b. For example, the first wiring electrode 281 is extended to an upper surface of the passivation layer 270 on the first conductive semiconductor layer 253 through a first contact hole 271 formed on the first conductive semiconductor layer 253. The second wiring electrode 282 is extended to an upper surface of the passivation layer 270 through a second contact hole 272 formed on the second conductive semiconductor layer 255. However, for another example, when the second conductive electrode 256 (see FIG. 5D) is present on an upper surface of the second conductive semiconductor layer 255, the second wiring electrode 282 can be extended to an upper surface of the passivation layer 270 through the second contact hole 272.

According to such a structure, although transfer is carried out by self-assembly, the wiring lines of the flip-chip type semiconductor light emitting devices can be implemented. In this case, the passivation layer 270 can be disposed on a front side of the display device 100 (see FIG. 1), and at this time, the first wiring electrode 281 and the second wiring electrode 282 can be transparent electrodes. At this time, the pair electrode 261c made of a metal material can be used as a reflective layer. Also, a first pair electrode and a second pair electrode among the pair electrodes 261c can be spaced apart from each other with a gap, and one or more of the semiconductor light emitting devices 250 can be disposed over the gap.

For another example, the passivation layer 270 can be disposed on a rear side of the display device 100, and at this time, the dielectric layer 261b and the base portion 261a of the substrate 261 are formed of a transparent material.

According to the process and device of the present disclosure described above, a large number of semiconductor light emitting devices can be pixelated on a wafer having a small size, and then directly transferred onto a large-area substrate. Through this, it can be possible to fabricate a large-area display device at a low cost.

What is claimed is:

1. A display device, comprising:
   a substrate;
   a passivation layer on the substrate and having a plurality of cells;
   a plurality of semiconductor light emitting devices on the substrate and respectively accommodated in the plurality of cells;
   a first wiring electrode and a second wiring electrode respectively extended from a semiconductor light emitting device from among the plurality of semiconductor light emitting devices to supply an electric signal to the semiconductor light emitting device;
   a plurality of pair electrodes disposed on the substrate, and including a first pair electrode and a second pair electrode configured to generate an electric field when an electric current is supplied thereto; and
   a dielectric layer formed to cover the plurality of pair electrodes,
   wherein the first wiring electrode and the second wiring electrode are formed on an opposite side with respect to the plurality of semiconductor light emitting devices from the plurality of the pair electrodes,
   wherein the plurality of cells are arranged in a matrix structure, and
   wherein the plurality of pair electrodes are extended to neighboring cells.

2. The display device of claim 1,
   wherein the first wiring electrode and the second wiring electrode are extended on one surface of the passivation layer.

3. The display device of claim 1, wherein the passivation layer is made of a polymer material or an inorganic material, and an electric field generated by the plurality of pair electrodes inside the plurality of cells.

4. The display device of claim 2, wherein one surface of the passivation layer is opposite to a surface of the passivation layer covering the dielectric layer.

5. The display device of claim 1, wherein the plurality of semiconductor light emitting devices are disposed between the first pair electrode and the second pair electrode among the plurality of pair electrodes.

6. The display device of claim 5, wherein each of the plurality of semiconductor light emitting devices comprises:
   a first conductive semiconductor layer; and
   a second conductive semiconductor layer overlapping with the first conductive semiconductor layer, and on the dielectric layer,
   wherein one surface of the second conductive semiconductor layer is partially covered by the first conductive semiconductor layer.

7. The display device of claim 6,
   wherein the passivation layer has a first contact hole to expose a portion of the first conductive semiconductor layer and a second contact hole to expose a portion of the second conductive semiconductor layer, and
   wherein the first wiring electrode contacts the first conductive semiconductor layer via the first contact hole, and the second wiring electrode contacts the second conductive semiconductor layer via the second contact hole.

8. The display device of claim 1, wherein the first pair electrode and the second pair electrode are spaced apart from each other with a gap, and
   wherein the plurality of semiconductor light emitting devices are disposed over the gap.

9. A method of fabricating a display device, the method comprising:
   transferring a substrate to an assembly position, and placing a plurality of semiconductor light emitting devices each having a first conductive semiconductor layer and a second conductive semiconductor layer into a fluid chamber;
   guiding a movement of the plurality of semiconductor light emitting devices in the fluid chamber to assemble the plurality of semiconductor light emitting devices at preset positions of the substrate;
   etching at least one of the first conductive semiconductor layer and the second conductive semiconductor layer while the plurality of semiconductor light emitting devices are placed at the preset positions of the substrate; and
   connecting a first wiring electrode and a second wiring electrode respectively to each of the plurality of semiconductor light emitting devices.

10. The method of claim 9, wherein the plurality of semiconductor light emitting devices are each provided with a magnetic body, and guided to the preset positions of the substrate by an electric field and a magnetic field.

11. The method of claim 10, wherein the assembly process comprises:
   applying the magnetic field to the plurality of semiconductor light emitting devices to move the plurality of semiconductor light emitting devices along a direction in the fluid chamber; and guiding the plurality of semiconductor light emitting devices to the preset positions of the substrate by applying the electric field so as to allow the plurality of semiconductor light emitting devices to be placed at the preset positions during the movement of the plurality of semiconductor light emitting devices.

12. The method of claim 10, further comprising removing the magnetic body from each of the plurality of semiconductor light emitting devices.

13. The method of claim 12, wherein the magnetic body performs as an etch resist for one of the first conductive semiconductor layer or the second conductive semiconductor layer.

14. The method of claim 9, further comprising:
forming a passivation layer on the substrate and the plurality of semiconductor light emitting devices so that a height of the passivation layer is greater than a height of the plurality of semiconductor light emitting devices, and
forming at least one contact hole in the passivation layer for each of the plurality of semiconductor light emitting devices.

15. The method of claim 9, wherein the substrate includes a plurality of pair electrodes, the plurality of pair electrodes including a first pair electrode and a second pair electrode,
wherein the first pair electrode and the second pair electrode are spaced apart from each other with a gap, and
wherein the plurality of semiconductor light emitting devices are disposed over the gap.

16. A method of fabricating a display device, the method comprising:
forming a plurality of semiconductor light emitting devices each having a magnetic body, a first conductive semiconductor layer, and a second conductive semiconductor layer;
transferring a substrate to an assembly position, and placing the plurality of semiconductor light emitting devices into a fluid chamber;
guiding a movement of the plurality of semiconductor light emitting devices in the fluid chamber using a magnetic force, and assembling the plurality of semiconductor light emitting devices at preset positions of the substrate using an electric field;
removing the magnetic body from the plurality of semiconductor light emitting devices placed at the preset positions of the substrate;
etching at least one of the first conductive semiconductor layer and the second conductive semiconductor layer; and
connecting a first wiring electrode and a second wiring electrode respectively to each of the plurality of plurality of semiconductor light emitting devices.

17. The method of claim 16, wherein the magnetic body is protruded from one of the first conductive semiconductor layer or the second conductive semiconductor layer to be etched between the first conductive semiconductor layer and the second conductive semiconductor layer.

18. The method of claim 16, wherein the magnetic body performs as an etch resist for one of the first conductive semiconductor layer or the second conductive semiconductor layer.

* * * * *